(12) United States Patent
Kawakami

(10) Patent No.: US 6,909,288 B2
(45) Date of Patent: Jun. 21, 2005

(54) BATTERY REMAINING AMOUNT WARNING CIRCUIT

(75) Inventor: Chikuni Kawakami, Asaka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 189 days.

(21) Appl. No.: 10/609,587

(22) Filed: Jul. 1, 2003

(65) Prior Publication Data

US 2004/0017199 A1 Jan. 29, 2004

(30) Foreign Application Priority Data

Jul. 2, 2002 (JP) ........................................ 2002-192794

(51) Int. Cl.[7] ............................................. H01N 27/416
(52) U.S. Cl. ....................................................... 324/433
(58) Field of Search ................................ 324/426, 427, 324/433, 434; 320/132, 149

(56) References Cited

U.S. PATENT DOCUMENTS 4,356,481 A  10/1982  Kuki
5,969,529 A  * 10/1999  Eiraku et al. ............... 324/433

FOREIGN PATENT DOCUMENTS

| JP | 55-136818 | 10/1980 |
| JP | 63-3538 | 1/1988 |
| JP | 2000-56370 | 2/2000 |

* cited by examiner

Primary Examiner—Edward H. Tso
(74) Attorney, Agent, or Firm—Sughrue Mion, PLLC

(57) ABSTRACT

It is an object of the present invention to provide a battery remaining amount warning circuit capable of issuing a battery remaining amount warning after battery power is fully used, consuming less power and issuing a warning at appropriate timing for various types of battery. The A/D converter measures a voltage value of the battery and when the voltage value of the battery falls to a specified level due to consumption, etc., of the battery, the A/D converter intermittently feeds the dummy-load circuit with a difference current representing a difference between a current value in a specific operating mode and a current value in another operating mode, measures the voltage of the battery and detects a voltage drop of the battery. When the difference current flows into the dummy-load circuit, a load applies to the battery the moment the current flows, causing a voltage drop.

3 Claims, 5 Drawing Sheets

CURRENT   CURRENT = (E − 0.6) / RESISTANCE R

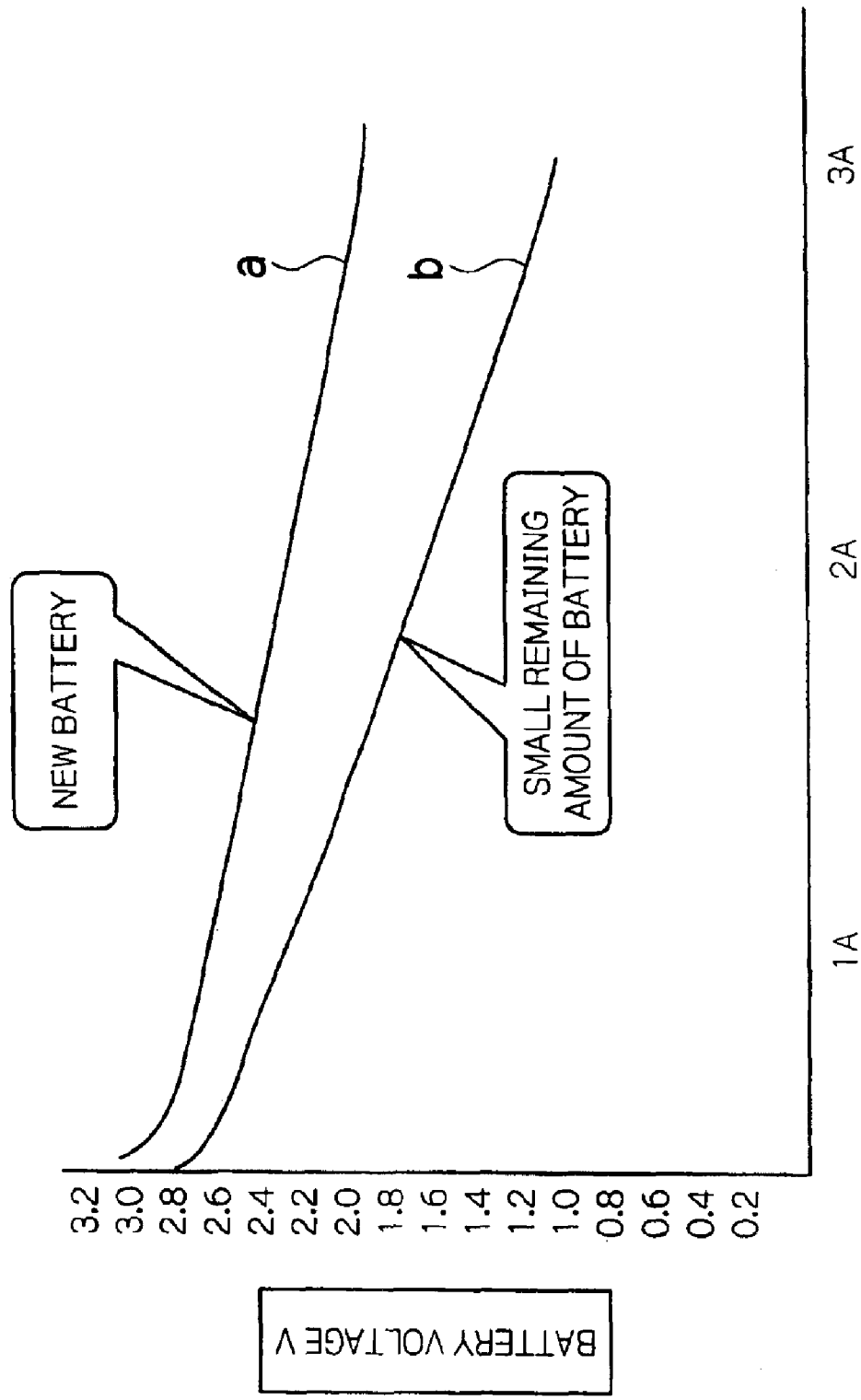

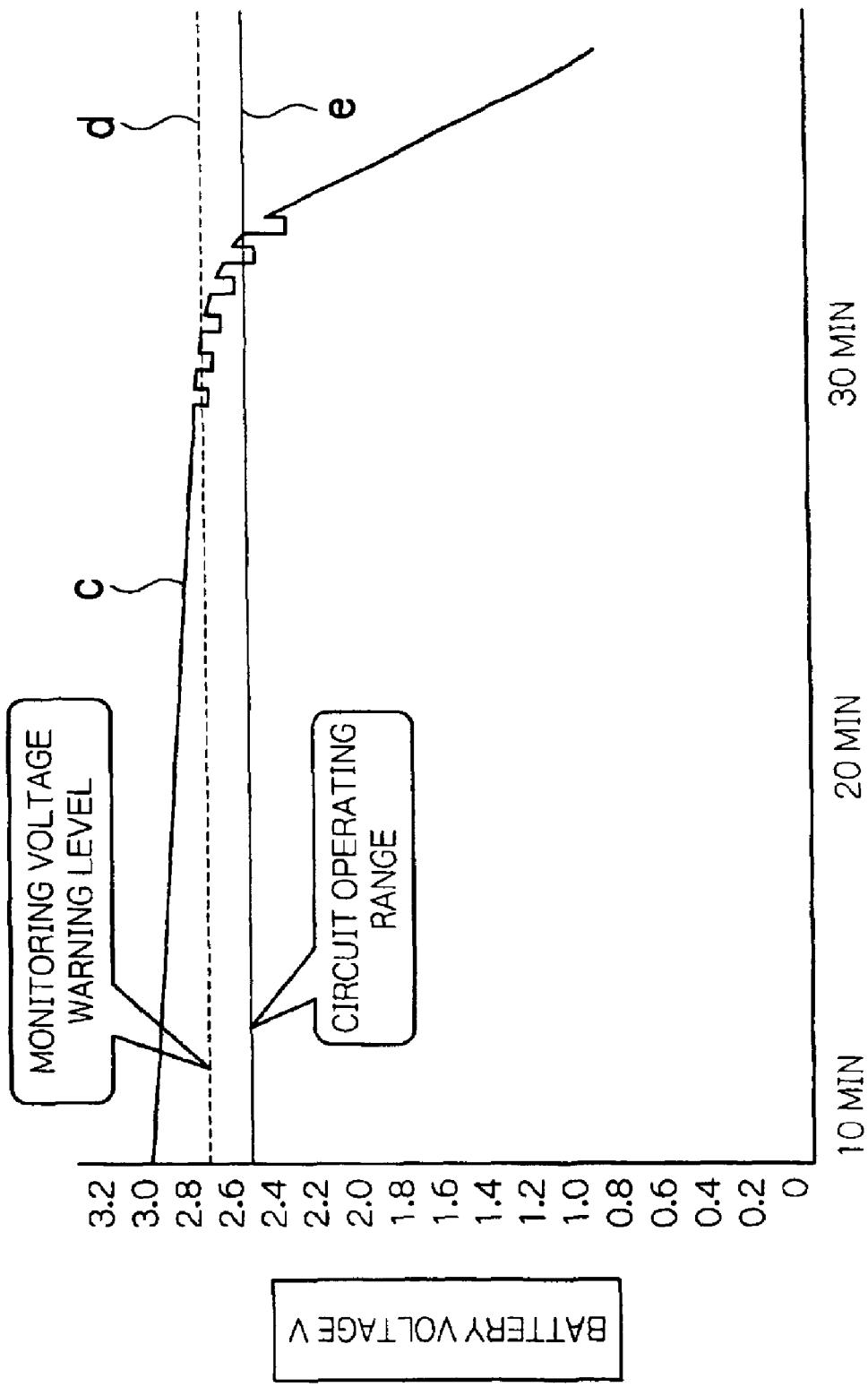

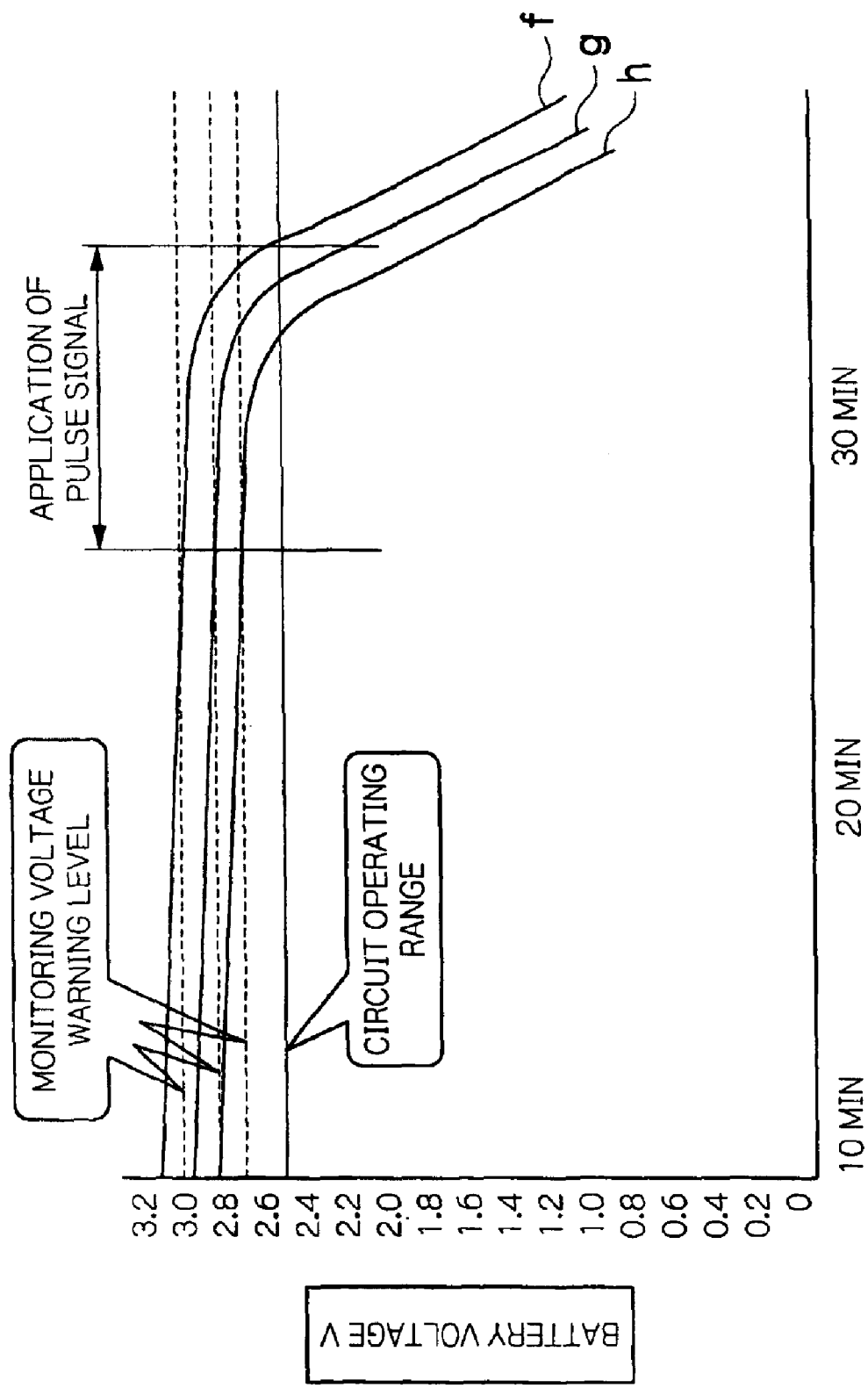

BATTERY REMAINING AMOUNT WARNING CIRCUIT

BACKGROUND OF THE INVENTION

1. Field of the Invention

The present invention relates to a battery remaining amount warning circuit applicable to an electrical product or electronic device using a battery.

2. Description of the Related Art

Today, many electrical products and electronic devices use batteries. As a conventional method for warning about a remaining amount of a battery, it is a general practice that a battery voltage is measured and a warning about the remaining amount is issued when the battery voltage falls below a specified value or DC resistance of the battery increases.

There are a variety of types of battery such as alkaline cell, nickel hydrogen cell, nickel cadmium cell, and there are also a variety of battery characteristics. However, with a monitoring of the battery voltage alone, depending on the type of the battery, the battery power may not be used to the full because a considerable amount of the battery can still be used after the warning is given about the insufficient remaining amount of the battery.

Furthermore, there is also a proposal of a method for constantly measuring a battery voltage by providing a dummy-load circuit (Japanese Patent Publication No. 63-3538). However, this method increases unnecessary power consumption.

There is also a proposal of a method for deciding whether a camera operates normally or not based on a boosting operation of a booster circuit when a flash capacitor is charged (Japanese Patent Application Publication No. 2000-56370), but when no flash is used or can be used, there is no way to decide it.

Furthermore, when the remaining amount of the battery is predicted from the battery voltage, the voltage varies depending on the type of the battery and when the battery voltage is low because of the nature of the type of the battery, a warning is issued earlier. For example, a warning is issued with an alkaline cell at 1.5 V/cell and with a NiCd cell at 1.2 V/cell.

SUMMARY OF THE INVENTION

In view of the above-described circumstances, it is an object of the present invention to provide a battery remaining amount warning circuit capable of using battery power sufficiently before issuing a warning about the remaining amount of the battery and issuing a warning for a variety of types of battery with small power consumption at appropriate timing.

A first aspect of the present invention is a battery remaining amount warning circuit that detects a voltage drop of a battery of an electronic device, including a dummy-load circuit connected to the battery, a storage device which stores a current value in each of various operating modes of the electronic device, a current addition device which intermittently feeds the dummy-load circuit with a difference current representing a difference between a current value in a specific operating mode out of the various operating modes and a current value of another operating mode out of the various operating modes stored in the storage device, a measuring device which measures a voltage of the battery, causes, when the voltage value of the battery falls to a specified level, the current addition device to intermittently feed the dummy-load circuit with the difference current and measures DC resistance or voltage of the battery when the current flows, and a warning device which gives a warning when a voltage drop of the battery is detected from the DC resistance value or voltage value measured by the measuring device.

The invention according to the first aspect measures the voltage value of the battery through the measuring device and causes, when the voltage value of the battery falls to a specified level due to consumption, etc., of the battery in a specific operating mode, the current addition device to intermittently feed the dummy-load circuit which is connected to the battery with the difference current, measures the DC resistance or voltage of the battery when the current flows and detects a voltage drop of the battery from the DC resistance value or voltage value for warning. The difference current is a current corresponding to a difference between a current value in a specific operating mode and a current value in another operating mode. That is, when the difference current flows into the dummy-load circuit, a load applies to the battery the moment the current flows, which causes a voltage drop.

This aspect is characterized in that the battery voltage is measured and monitored and when the battery voltage falls to a specified level, the dummy-load circuit is fed a difference current intermittently and the DC resistance of the battery or battery voltage is measured, which improves the accuracy of warning about the battery life.

A second aspect of the present invention comprises the battery remaining amount warning circuit according to the first aspect, characterized in that the current value in the other operating mode is greater than the current value in the specific operating mode.

According to the second aspect, when the current value in the specific operating mode flows into the battery a voltage drop occurs in the battery. If the current value in the other operating mode is greater than the current value in the specific operating mode, a load greater than a normal load is applied to the battery when the difference current is added to the dummy-load circuit, which produces a voltage drop making it possible to predict the remaining amount of the battery accurately.

A third aspect comprises the battery remaining amount warning circuit according to the first aspect, wherein the electronic device is a digital camera and the various operating modes are a playback mode, recording mode, flash charge recording mode, etc., of the digital camera.

The third aspect makes it possible to detect a voltage drop of the battery of the digital camera. For example, a flash charge recording mode has normally a larger current value than that of the playback mode, and therefore in the playback mode if a difference current between a current value in the playback mode and a current value in the flash charge recording mode is applied to the dummy-load circuit, a larger load than that in the playback mode is applied to the battery, which produces a voltage drop and makes it possible to predict the remaining amount of the battery accurately.

The present invention can issue a battery remaining amount warning after the battery power is fully used and apply a current to the dummy-load circuit intermittently only after the battery voltage falls to a specified level, which consumes less power and prevents premature warnings for various types of battery.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 4 illustrates variations in battery voltages according to the currents of a new battery a and a battery b having a small amount of remaining power;

FIG. 5 is a graph showing a voltage value of the battery at a connection point Z; and FIG. 6 is a graph showing variations in voltage values of various batteries.

DETAILED DESCRIPTION OF THE PREFERRED EMBODIMENTS

With reference now to the attached drawings, an embodiment of a battery remaining amount warning circuit according to the present invention will be explained below. This embodiment will be explained as the battery remaining amount warning circuit built in a digital camera.

Figure 1:
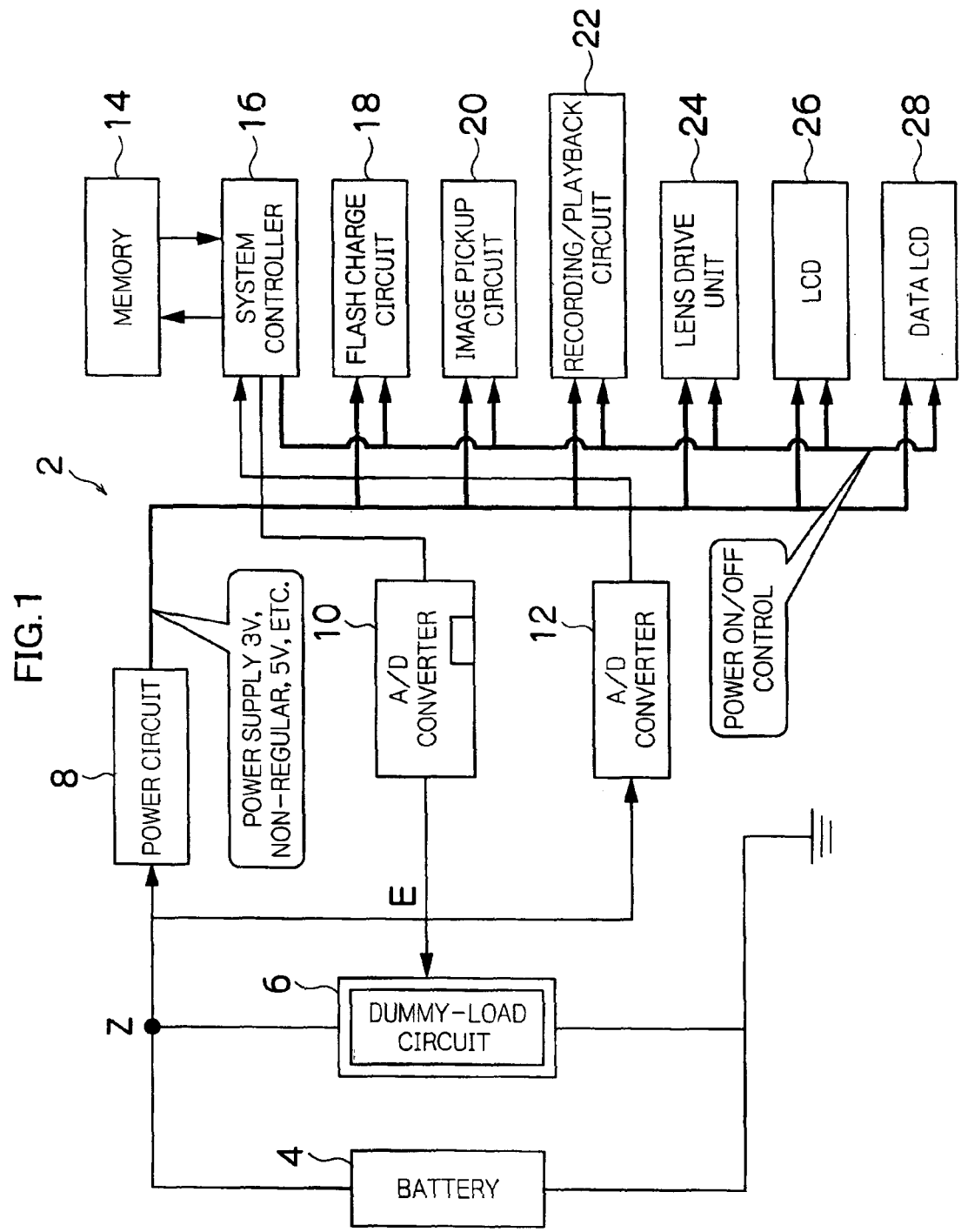
FIG. 1 is a block diagram showing a configuration of a digital camera.

FIG. 1 is a block diagram showing a configuration of a digital camera 2.

The digital camera 2 includes a flash charge circuit 18, an image pickup circuit 20, a recording/playback circuit 22, a lens drive unit 24, an LCD 26, a data LCD 28 and a system controller 16 that sends control signals to these circuits, etc. The system controller 16 exchanges data with a memory 14. A power circuit 8 is connected to the circuits 18 to 28 and power is supplied from the power circuit 8 to the circuits 18 to 28.

A battery 4 is connected in parallel to a dummy-load circuit 6 and one end of the connection is grounded and the other end Z is connected to the power circuit 8. An A/D converter 10 is connected to the system controller 16 and a pulse current, which will be described later, is applied from the A/D converter 10 to the dummy-load circuit 6 under the instruction of the system controller 16. The connection point Z is also connected to an A/D converter 12 and the A/D converter 12 is connected to the system controller 16. A voltage value at the connection point Z and a voltage drop value when a pulse current is applied to the dummy-load circuit 6 are input to the A/D converter 12 and the A/D-converted voltage value and voltage drop value are input to the system controller 16. The system controller 16 sends a control signal for the transmission of a pulse current to be applied to the dummy-load circuit 6 to the A/D converter 10 based on the input voltage value and voltage drop value.

Figure 2:
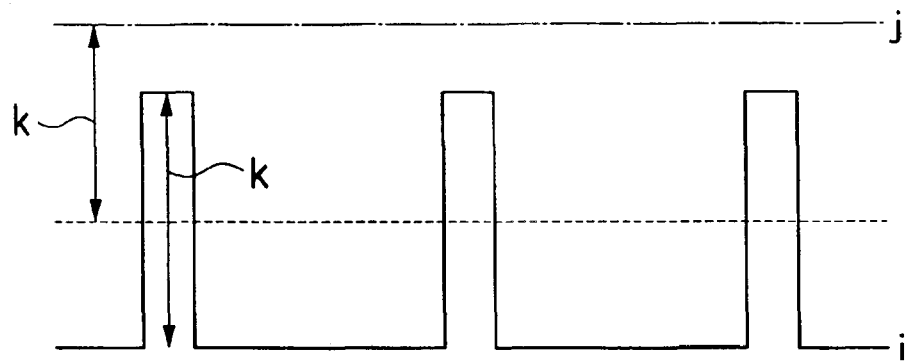
FIG. 2 is a schematic view of a pulse current applied to a dummy-load circuit.

FIG. 2 is a schematic view of the pulse current applied to the dummy-load circuit 6. The pulse current is a digitized pulse-shaped current applied from the A/D converter 10, and therefore the current corresponding to a peak value is applied intermittently. The peak value of the pulse current is k. This k value is a difference between a current value i in a current operating mode and a current value j in another operating mode. For example, assuming that the digital camera is operating in a playback mode, a difference between the current value (i) in the playback mode and the current value (j) in a flash charge recording mode is k.

The current value in the flash charge recording mode is stored in the memory 14. The A/D converter 12 detects a voltage value at the connection point Z, inputs the detected value to the system controller 16 and the system controller 16 extracts the current value in the flash charge recording mode from the memory 14 based on the detected value, calculates the difference k and instructs the A/D converter 10 to apply a current whose peak value corresponds to the difference value. The A/D converter 10 applies a pulse current having a peak value k to the dummy-load circuit 6 based on the instruction.

Here, the current value in the flash charge recording mode is taken as an example because the current value in the flash charge recording mode is the highest current value among the modes of the digital camera and applying the difference current k representing a difference from the flash charge recording mode causes a maximum voltage drop of the battery 4 to appear, which has a large effect in measuring the remaining amount of the battery. Generally, it is preferred to set, if not the flash charge recording mode, a current value in a mode having a higher current value than a current value in the playback mode as a reference for calculating k. That is, if j has a greater value than i, the value (j−i) functions as a value of the difference current. For example, suppose the current value when the system controller 16 is ON is 100 mA and the current value 400 mA when the image pickup circuit 20 is ON is stored in the memory 14. With a difference 300 mA from 100 mA to 400 mA, the voltage drop is 0.3 V. Since the voltage drop with a variation of 300 mA is 0.3 V, the battery resistance is 1 Ω. Actually, this current of 300 mA is applied to the dummy-load circuit 6.

By the way, the memory 14 also stores current values in other modes. This embodiment adopts a configuration of storing current values in the memory 14, but it is also possible to provide a storage device capable of storing electrically erasable data (e.g., EEPROM) aside from the memory 14 and store current values in various modes in this storage device. In this way, it is conveniently possible to record current values in operating modes which vary depending on the model after the circuit is installed.

Figure 3:
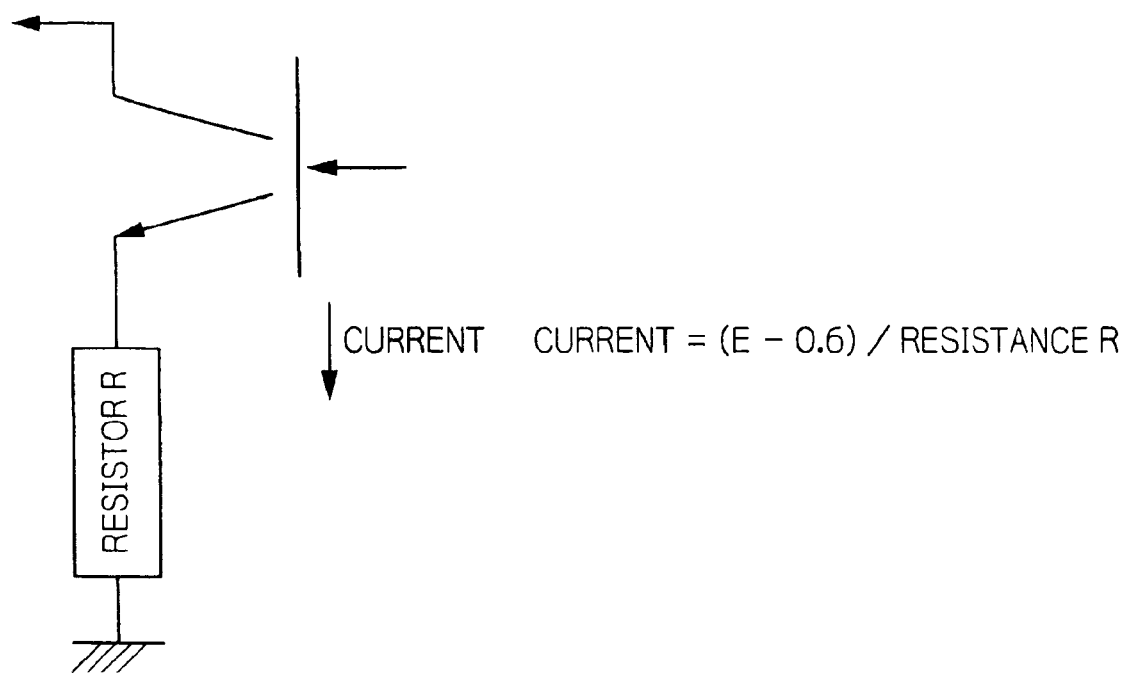
FIG. 3 is a schematic view of the dummy-load circuit.

A pulse current at a control voltage of E is applied to the dummy-load circuit 6. The dummy-load circuit 6 has a configuration shown in FIG. 3 and the pulse current applied from the A/D converter 10 corresponds to a current applied from the base of an NPN type transistor. Because a resistance R is connected to the emitter, the current of {voltage (E−0.6)/(resistance R)} flows through the resistor R. That is, the current of {voltage (E−0.6)/(resistance R)} flows through the dummy-load circuit 6.

FIG. 4 illustrates variations in battery voltages according to the currents of a new battery a and a battery b having a small amount of remaining power. The rate of decrease of the battery voltage of the battery having a small amount of remaining power becomes more notable as the current value increases.

FIG. 5 is a graph showing a voltage value c of the battery 4 at the connection point Z. As described above, the voltage value c is input from the A/D converter 12 to the system controller 16, and therefore it is always measured. According to FIG. 5, the initial voltage value 3.0 V decreases gradually. By the way, the voltage value of the power circuit 8 is 3.0 V. A warning level d among monitoring voltage levels, is set to 2.7 V and when the voltage value c falls below 2.7 V, a pulse current is applied to the dummy-load circuit 6 from the A/D converter 10.

When the pulse current is applied, a maximum load is applied to the battery 4 and the moment the load is applied, the voltage of the battery drops. Past 30 minutes, the battery voltage value starts to drop drastically, causing the internal resistance of the battery 4 to increase. Therefore, when the pulse current is applied, the drop of the battery voltage also increases gradually. The voltage drop value is also input from the A/D converter 12 to the system controller 16, and therefore it is measured. The power circuit 8 operates normally when the battery voltage is 2.5 V or higher. If the voltage that drops when the pulse current is applied falls below 2.5 V, the system controller 16 issues a control signal to the data LCD 28 and a warning about the remaining amount of the battery is displayed on the data LCD 28. As a result, the operator of the digital camera 2 recognizes that the remaining amount of the battery voltage is running short.

Thus, this embodiment feeds the dummy-load circuit 6 with a difference current when the voltage starts to drop in addition to measurement of the battery voltage in an actual operating state, and can thereby predict the life of the battery accurately and select a mode that matches the remaining voltage as the operating mode after a warning is issued. Furthermore, since this embodiment allows a sufficient amount of battery power to be used before a warning about the battery remaining amount is issued, there will be no such case that several tens of images can still be taken after a warning about the remaining amount of the battery is issued. Moreover, the current is applied intermittently to the dummy-load circuit 6 after the battery voltage falls below a warning level, which takes only a short time resulting in less power consumption.

FIG. 6 is a graph showing variations in voltage values of various batteries. The voltage characteristic changes depending on the battery. Here, three types f, g and h are shown. For all three cases, it is preferable to limit the range within which, for example, a pulse current is applied to the dummy-load circuit 6 within the range shown in the drawing. This is because it is preferable to start accurate monitoring of the voltage value a certain time before the voltage value drops drastically. In that case, it is also preferable to set the monitoring voltage warning level to 3.1 V, 2.9 V and 2.7 V for f, g and h, respectively. If the circuit operating range is set to 2.5 V, when the voltage value that drops when the pulse current is applied falls below 2.5 V, the system controller 16 issues a control signal to the data LCD 28 and shows a battery remaining amount warning on the data LCD 28. Thus, setting the monitoring voltage warning level for each type of the battery prevents premature issuance of warnings for various types of battery.

The above-described explanations have described the case where the voltage value of the battery is measured when the voltage value of the battery is constantly measured as well as when the voltage value of the battery is measured when a pulse current is applied, but it is also possible to adopt a method for measuring DC resistance of the battery in both cases.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A battery remaining amount warning circuit that detects a voltage drop of a battery of an electronic device, comprising:

a dummy-load circuit connected to the battery;

a storage device which stores a current value in each of various operating modes of the electronic device;

a current addition device which intermittently feeds the dummy-load circuit with a difference current representing a difference between a current value in a specific operating mode out of the various operating modes and a current value of another operating mode out of the various operating modes stored in the storage device;

a measuring device which measures a voltage of the battery, causes, when the voltage value of the battery falls to a specified level, the current addition device to intermittently feed the dummy-load circuit with the difference current and measures DC resistance or voltage of the battery when the current flows; and a warning device which gives a warning when a voltage drop of the battery is detected from the DC resistance value or voltage value measured by the measuring device.

2. The battery remaining amount warning circuit according to claim 1, wherein the current value in said another operating mode is greater than the current value in the specific operating mode.

3. The battery remaining amount warning circuit according to claim 1, wherein the electronic device is a digital camera and the various operating modes are a playback mode, recording mode, flash charge recording mode, etc., of the digital camera.

* * * * *